(12) United States Patent
Hopper et al.

(10) Patent No.: US 8,722,505 B2
(45) Date of Patent: May 13, 2014

(54) SEMICONDUCTOR CAPACITOR WITH LARGE AREA PLATES AND A SMALL FOOTPRINT THAT IS FORMED WITH SHADOW MASKS AND ONLY TWO LITHOGRAPHY STEPS

(75) Inventors: Peter J. Hopper, San Jose, CA (US); William French, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 862 days.

(21) Appl. No.: 12/917,843

(22) Filed: Nov. 2, 2010

(65) Prior Publication Data

US 2012/0104548 A1 May 3, 2012

(51) Int. Cl.
*H01L 27/01* (2006.01)
(52) U.S. Cl.
USPC .................. 438/396; 438/387; 257/E27.048; 257/E27.071
(58) Field of Classification Search
USPC ............ 257/E27.048, E27.071; 438/387, 396
See application file for complete search history.

(56) References Cited

U.S. PATENT DOCUMENTS

| | | | |
|---|---|---|---|
| 4,827,323 A | 5/1989 | Tigelaar et al. | |
| 6,437,385 B1 | 8/2002 | Bertin et al. | |
| 6,565,730 B2 | 5/2003 | Chakravorty et al. | |
| 6,784,519 B2 * | 8/2004 | Iwamoto et al. | 257/532 |
| 6,963,483 B2 * | 11/2005 | Chakravorty et al. | 361/306.3 |
| 2002/0109175 A1 | 8/2002 | Iwamoto et al. | |
| 2010/0207246 A1 * | 8/2010 | Booth et al. | 257/532 |

OTHER PUBLICATIONS

U.S. Appl. No. 12/756,097, filed Apr. 7, 2010 to Peter J. Hopper et al.
PCT International Search Report for PCT/US2011/049927.
PCT Written Opinion of the International Searching Authority for PCT/US2011/049927.

* cited by examiner

*Primary Examiner* — Marcos D. Pizarro
(74) *Attorney, Agent, or Firm* — Eugene C. Conser; Wade J. Brady, III; Frederick J. Telecky, Jr.

(57) ABSTRACT

A semiconductor capacitor with large area plates and a small footprint is formed on a semiconductor wafer by forming an opening in the wafer, depositing a first metal atoms through a first shadow mask that lies spaced apart from the wafer to form a first metal layer in the opening, a dielectric layer on the first metal layer, and a second metal atoms through a second shadow mask that lies spaced apart from the wafer to form a second metal layer on the dielectric layer.

13 Claims, 11 Drawing Sheets

SEMICONDUCTOR CAPACITOR WITH LARGE AREA PLATES AND A SMALL FOOTPRINT THAT IS FORMED WITH SHADOW MASKS AND ONLY TWO LITHOGRAPHY STEPS

BACKGROUND OF THE INVENTION

1. Field of the Invention

The present invention relates to semiconductor capacitors and, more particularly, to a semiconductor capacitor with large area plates and a small footprint that is formed with shadow masks and only two lithography steps.

2. Description of the Related Art

A semiconductor capacitor is a well-known structure that typically includes two metal plates that are vertically separated by a dielectric layer. Semiconductor capacitors are commonly formed as part of the metal interconnect structure, which allows the capacitors to be formed without requiring any additional lithography steps.

For example, the lower capacitor plate can be formed at the same time that a first metal layer is etched to form a first layer of metal traces, while the upper capacitor plate can be formed at the same time that a second metal layer is etched to form a second layer of metal traces. In this case, the interlayer dielectric that electrically isolates the first layer of metal traces from the second layer of metal traces functions as the capacitor dielectric.

Although a capacitor which is formed as part of the metal interconnect structure does not require any additional lithography steps, and thus comes for free, the capacitance of the capacitor is limited by the available area and the requirements of the metal interconnect structure. In other words, the area that can be occupied by a capacitor, the vertical spacing between the first and second layers of metal traces, and the material used as the interlayer dielectric are defined by the requirements of the metal interconnect structure, not by the requirements of the capacitor.

When not defined by the requirements of the metal interconnect structure, the capacitance provided by a capacitor can be increased by utilizing different dielectric materials, such as high k materials. In addition, the capacitance can be increased by increasing the area of the plates. One common approach to forming a capacitor with large area plates and a small footprint is to form plates that conformally line an opening anisotropically dry etched in the substrate.

Another common approach to forming a capacitor with large area plates and a small footprint is to use a number of small area interleaved plates, where each odd numbered plate is connected together to form a first capacitor plate, and each even number plate is connected together to form a second capacitor plate. Thus, even though the area of each plate is small, the effective areas of the first and second capacitor plates are much larger. A further approach is to form a number of interleaved plates in an opening anisotropically dry etched in the substrate.

These approaches to increasing the capacitance provided by a capacitor, however, typically require a large number of lithography steps. Lithography, in turn, is one of the most expensive steps in a semiconductor fabrication process. In addition, when capacitor plates are formed to conformally line an opening anisotropically dry etched in the substrate, the materials deposited to form the capacitor tend to have a non-uniform thickness, and be very thin at the bottom corners of the opening where the bottom surface and the vertical side wall of the opening meet. As a result, these capacitors tend to have a higher defect rate.

Thus, there is a need for a capacitor with large area plates and a small footprint that is formed with a limited number of lithography steps.

BRIEF DESCRIPTION OF THE DRAWINGS

FIG. 1A is a cross-sectional view illustrating an example of a capacitor 100 in accordance with a first embodiment of the present invention. FIG. 1B is a cross-sectional view illustrating an example of a capacitor 150 in accordance with a second embodiment of the present invention.

FIG. 2A is a cross-sectional view illustrating an example of a metal deposition chamber 200 in accordance with the present invention. FIGS. 2B and 2C are plan views illustrating examples of shadow mask 214 in accordance with the present invention. FIG. 2B is a shadow mask 214A illustrating a first example of shadow mask 214 in accordance with the present invention, while FIG. 2C is a shadow mask 214B illustrating a second example of shadow mask 214 in accordance with the present invention.

FIG. 3A is a plan view, while FIG. 3B is a cross-sectional view taken along line 3B-3B of FIG. 3A.

FIG. 4A is a plan view, while FIG. 4B is a cross-sectional view taken along line 4B-4B of FIG. 4A. FIG. 4C is a cross-sectional view that illustrates an alternate embodiment.

FIG. 15A shows a first definitional shadow mask 1510, while FIG. 15B shows a second definitional shadow mask 1520.

DETAILED DESCRIPTION OF THE INVENTION

Figure 1A:
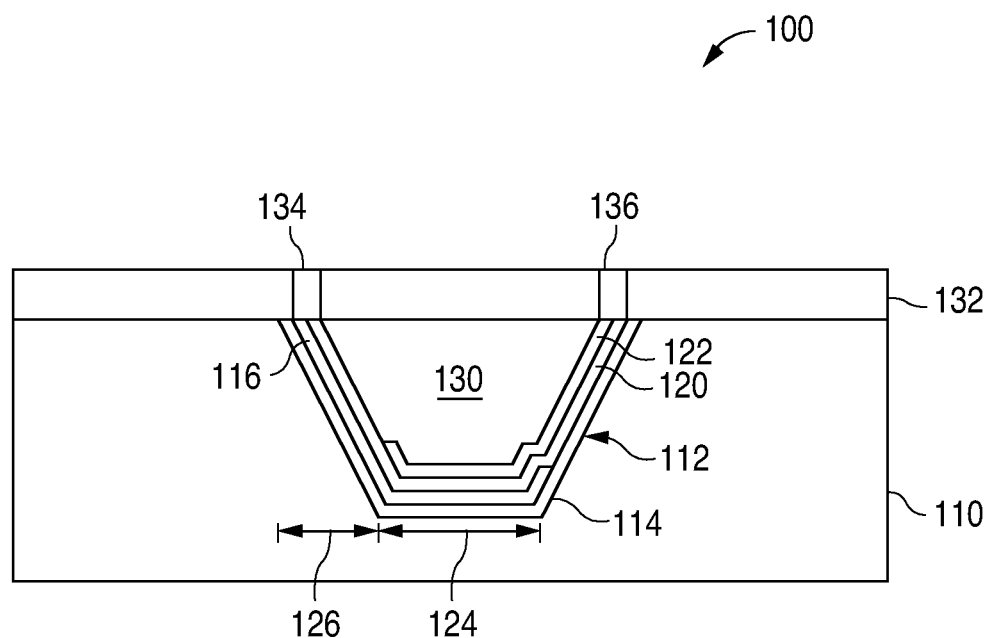
FIGS. 1A and 1B are views illustrating examples of capacitors in accordance with the present invention.
Figure 1B:
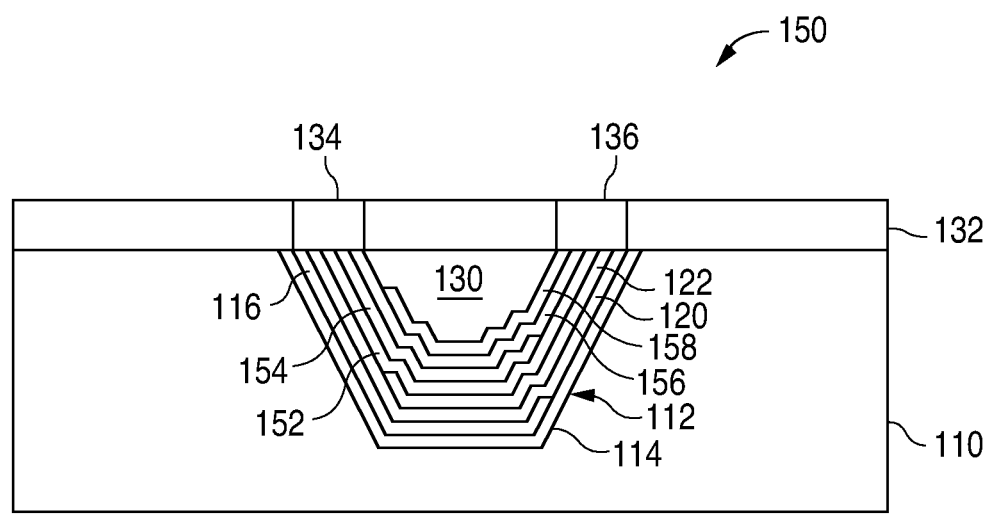

FIGS. 1A and 1B show views that illustrate examples of capacitors in accordance with the present invention. As described in greater detail below, the present invention is a capacitor with large area plates and a small footprint that is formed with shadow masks and only two lithography steps.

FIG. 1A shows a cross-sectional view that illustrates an example of a capacitor 100 in accordance with a first embodiment of the present invention. As shown in FIG. 1A example, capacitor 100 includes a semiconductor substrate 110, and an opening 112 in semiconductor substrate 110.

As further shown in FIG. 1A example, capacitor 100 includes a non-conductive layer 114 that lies within opening 112 and touches semiconductor substrate 110. Non-conductive layer 114 has a substantially uniform thickness. Capacitor 100 also includes a conductive structure 116 that lies completely within opening 112 and touches non-conductive layer 114. As with non-conductive layer 114, conductive structure 116 also has a substantially uniform thickness.

In addition, capacitor 100 includes a non-conductive layer 120 that lies completely within opening 112 and touches non-conductive layer 114 and conductive structure 116. Further, capacitor 100 includes a conductive structure 122 that lies completely within opening 112 and touches non-conductive layer 120. As above, non-conductive layer 120 and conductive structure 122 each has a substantially uniform thickness.

As additionally shown in the FIG. 1A example, the conductive structures 116 and 122 are arranged within opening 112 so that a first portion 124 of conductive structure 116 lies vertically below conductive structure 122, while a second portion 126 of conductive structure 116 lies vertically below no portion of conductive structure 122.

In addition, capacitor 100 includes a non-conductive region 130 that lies completely within opening 112 and touches non-conductive layer 120 and conductive structure 122. Further, capacitor 100 includes a non-conductive layer 132 that touches semiconductor substrate 110, non-conductive layer 114, conductive structure 116, non-conductive layer 120, conductive structure 122, and non-conductive region 130.

Capacitor 100 also includes a metal contact 134 and a metal contact 136. Metal contact 134 extends through non-conductive layer 132 so that the bottom surface of metal contact 134 makes an electrical connection with conductive structure 116. Similarly, metal contact 136 extends through non-conductive layer 130 so that the bottom surface of metal contact 136 makes an electrical connection with conductive structure 122.

Both metal contact 134 and metal contact 136 are electrically isolated from semiconductor substrate 110. In addition, metal contact 134 is spaced apart from and electrically isolated from conductive structure 122, while metal contact 136 is spaced apart from and electrically isolated from conductive structure 116.

FIG. 1B shows a cross-sectional view that illustrates an example of a capacitor 150 in accordance with a second embodiment of the present invention. Capacitor 150 is similar to capacitor 100 and, as a result, utilizes the same reference numerals to designate the elements which are common to both capacitors.

As shown in FIG. 1B example, capacitor 150 differs from capacitor 100 in that capacitor 150 further includes a non-conductive layer 152 that lies completely within opening 112 and touches non-conductive layer 120 and conductive structure 122. Capacitor 150 also includes a conductive structure 154 that lies completely within opening 112 and touches non-conductive layer 152.

In addition, capacitor 100 includes a non-conductive layer 156 that lies completely within opening 112 and touches non-conductive layer 152 and conductive structure 154. Further, capacitor 100 includes a conductive structure 158 that lies completely within opening 112 and touches non-conductive region 130 and non-conductive layer 156. As above, non-conductive layer 152, conductive structure 154, non-conductive layer 156, and conductive structure 158 each has a substantially uniform thickness.

The conductive structures 154 and 158 are arranged within opening 112 so that substantially all of conductive structure 154 lies vertically over conductive structure 116, and substantially all of conductive structure 158 lies vertically over conductive structure 122. Further, non-conductive layer 132 also touches non-conductive layer 152, conductive structure 154, non-conductive layer 156, and conductive structure 158.

In addition, the bottom surface of metal contact 134 makes an electrical connection with conductive structure 154, while metal contact 134 is spaced apart from and electrically isolated from conductive structure 158. Similarly, the bottom surface of metal contact 136 makes an electrical connection with conductive structure 158, while metal contact 136 is spaced apart from and electrically isolated from conductive structure 154.

As a result, capacitor 150 includes a first capacitor plate that includes conductive structures 116 and 154, and a second capacitor plate that includes conductive structures 122 and 158. Thus, compared to the two structures 116 and 122 used by capacitor 100, capacitor 150 illustrates that four or more interleaved structures can alternately be used to increase the effective areas of the capacitor plates and thereby the capacitance. Therefore, as a result of forming capacitors 100 and 150 in opening 112, capacitors 100 and 150 each have large area plates and a small footprint.

The method of the present invention utilizes a multi-chamber semiconductor processing system. A multi-chamber semiconductor processing system is a system that accepts a wafer, reduces the air pressure within the system to a level that is below atmospheric pressure, and then moves the wafer from chamber to chamber in a specified sequence without breaking the vacuum. While in each chamber, the wafer is subjected to a specific processing step.

For example, a multi-chamber semiconductor processing system can be implemented with a cluster tool or a sequencer. A cluster tool provides random access such that the specified sequence can be from any chamber to any other chamber. A sequencer, on the other hand, provides a fixed sequence of chambers.

In a first embodiment of the present invention, the multi-chamber semiconductor processing system includes three chambers: a first chamber for depositing a dielectric, a second chamber for depositing a metal, and a third chamber for depositing a metal. The first chamber can be implemented with any conventional dielectric deposition chamber, such as a chemical vapor deposition (CVD) chamber. The second and third chambers can be implemented with, for example, a plasma vapor deposition (PVD) chamber.

In accordance with the present invention, the second and third chambers of the multi-chamber semiconductor processing system are each modified to include a shadow mask that lies above and spaced apart from the to-be-processed surface of the wafer. A shadow mask is a metal plate, such as an aluminum plate, which has been processed to include a pattern that extends completely through the metal plate.

Figure 2A:
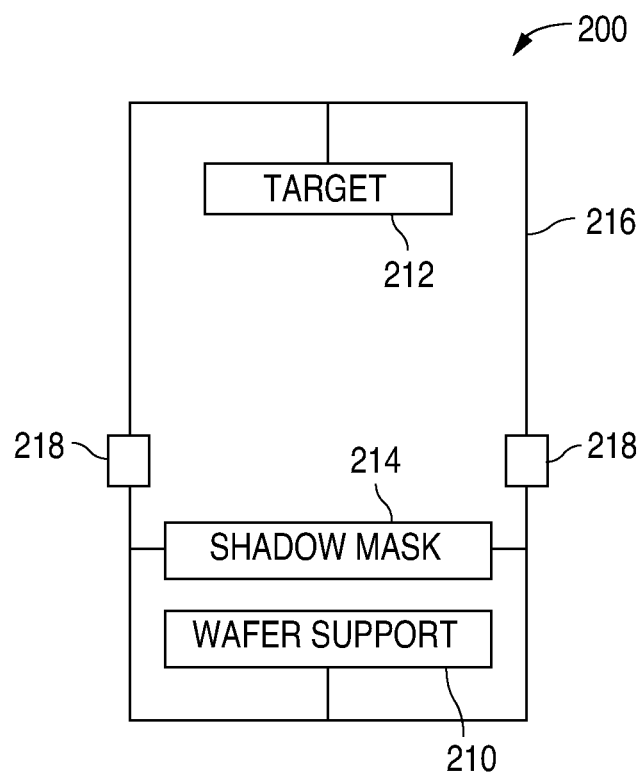
FIGS. 2A-2C are views illustrating an example of a semiconductor processing system in accordance with the present invention.
Figure 2B:
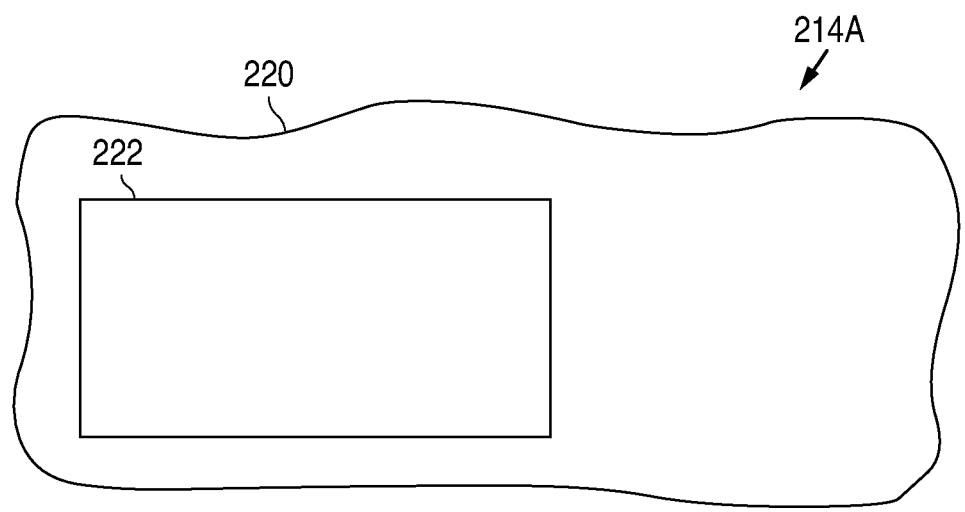
Figure 2C:
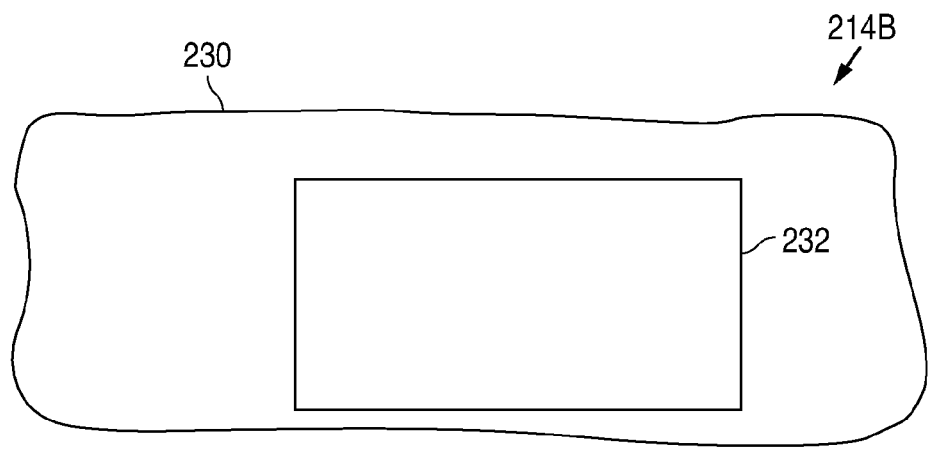

FIGS. 2A-2C shows views that illustrate an example of a semiconductor processing system in accordance with the present invention. FIG. 2A shows a cross-sectional view that illustrates an example of a metal deposition chamber 200 in accordance with the present invention. As shown in FIG. 2A, metal deposition chamber 200, which is sealed during operation, includes a wafer support 210, such as a chuck, a target 212 which lies above and spaced apart from wafer support 210, and a shadow mask 214 which lies between wafer support 210 and target 212.

In addition, metal deposition chamber 200 includes a frame structure 216 that is connected to wafer support 210, target 212, and shadow mask 214 to support wafer support 210, target 212, and shadow mask 214. Shadow mask 214 can be rigidly attached to frame structure 216 so that the distance between wafer support 210 and shadow mask 214 is fixed.

Optionally, the distance between wafer support 210 and shadow mask 214 can be varied. For example, frame structure 216 can include a vertical actuator 218 that vertically moves shadow mask 214. Alternately, wafer support 210, which can be vertically movable to engage a wafer that has been inserted into chamber 200, can be modified to include a larger vertical extension that allows the distance between wafer support 210 and shadow mask 214 to be varied.

Further, for added flexibility, metal deposition chamber 200 can include a shadow mask movement structure, such as a robotic arm, that is connected to frame structure 216 to move shadow mask 214 into position, and then remove shadow mask 214. The shadow mask movement structure allows metal deposition chamber 200 to be used with or without shadow mask 214 without the need to open chamber 200.

FIGS. 2B and 2C show plan views that illustrate examples of shadow mask 214 in accordance with the present invention. FIG. 2B shows a shadow mask 214A that illustrates a first example of shadow mask 214 in accordance with the present invention, while FIG. 2C shows a shadow mask 214B that illustrates a second example of shadow mask 214 in accordance with the present invention.

As shown in FIG. 2B, shadow mask 214A includes a metal plate 220, such as an aluminum plate, and an opening 222 that extends through metal plate 220. Similarly, as shown in FIG. 2C, shadow mask 214B includes a metal plate 230, such as an aluminum plate, and an opening 232 that extends through metal plate 230.

In accordance with the present invention, the second chamber of the multi-chamber semiconductor processing system is implemented with metal deposition chamber 200 where shadow mask 214 is implemented with shadow mask 214A, while the third chamber of the multi-chamber semiconductor processing system is implemented with metal deposition chamber 200 where shadow mask 214 is implemented with shadow mask 214B.

Figure 3A:
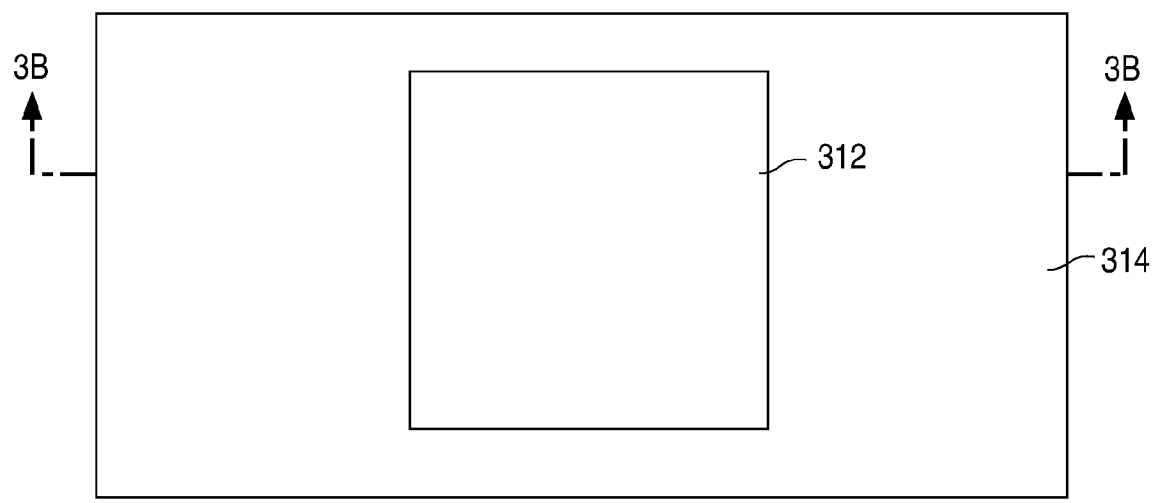
FIGS. 3A-3B are views illustrating an example of the first step of a method of forming a capacitor in accordance with the present invention.
Figure 3B:
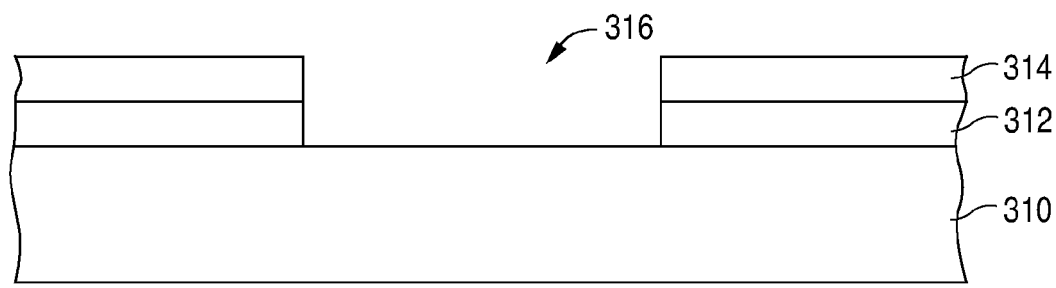

FIGS. 3A-3B show views that illustrate an example of the first step of a method of forming a capacitor in accordance with the present invention. FIG. 3A shows a plan view, while FIG. 3B shows a cross-sectional view taken along line 3B-3B of FIG. 3A. As shown in FIGS. 3A-3B, the method of the present invention utilizes a conventionally-formed semiconductor wafer 310. In the present example, a <100> silicon wafer is utilized, although other wafers can also be used.

As further shown in FIGS. 3A-3B, the method of the present invention begins by depositing a masking layer 312 on the top surface of wafer 310 in a conventional manner. Masking layer 312 can be implemented with, for example, silicon nitride. Following this, a patterned photoresist layer 314 is formed on the top surface of masking layer 312.

Patterned photoresist layer 314 is formed in a conventional manner, which includes depositing a layer of photoresist, projecting a light through a patterned black/clear glass plate known as a mask to soften the photoresist regions exposed by the light, and then removing the softened photoresist regions.

After patterned photoresist layer 314 has been formed, the exposed region of masking layer 312 is etched in a conventional manner to form an opening 316 that exposes the top surface of wafer 310. Once the top surface of wafer 310 has been exposed, patterned photoresist layer 314 is removed in a conventional manner.

Figure 4A:
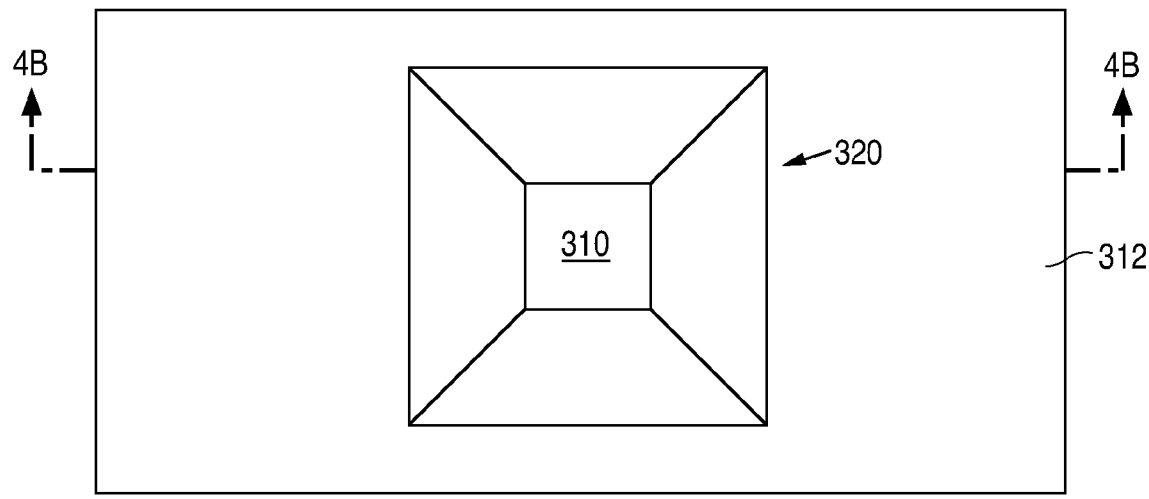
FIGS. 4A-4C are views illustrating an example of the second step of the method of forming the capacitor in accordance with the present invention.
Figure 4B:
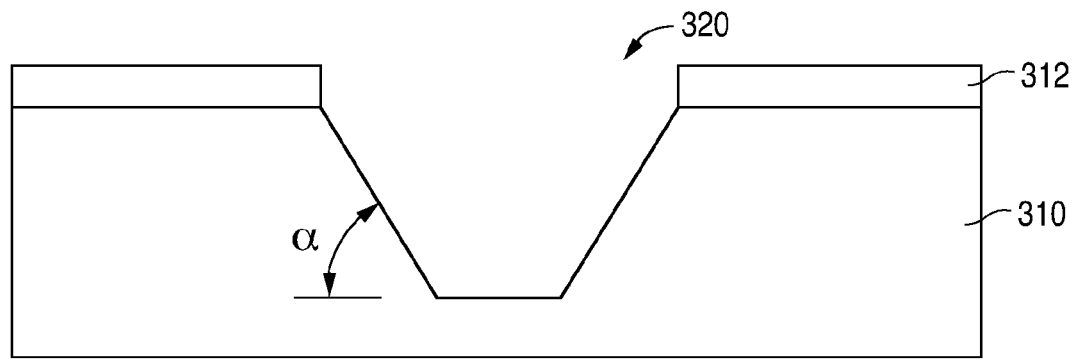
Figure 4C:
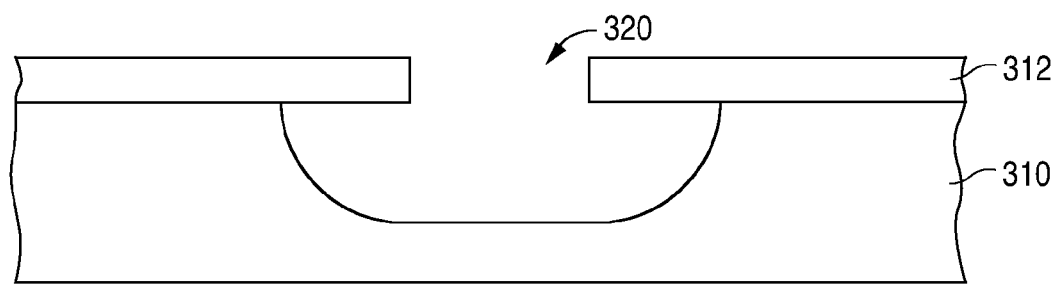

FIGS. 4A-4C show views that illustrate an example of the second step of the method of forming the capacitor in accordance with the present invention. FIG. 4A shows a plan view, while FIG. 4B shows a cross-sectional view taken along line 4B-4B of FIG. 4A. FIG. 4C shows a cross-sectional view that illustrates an alternate embodiment.

As shown in FIGS. 4A-4B, following the removal of patterned photoresist layer 314, wafer 310 is anisotropically wet etched in a conventional manner using conventional etchants, such as Tetra Methyl Ammonium Hydroxide (TMAH) or Potassium Hydroxide (KOH), to form an opening 320 in wafer 310. As further shown in FIGS. 4A-4B, an anisotropic wet etch of a <100> silicon wafer etches along the crystallographic planes to form opening 320 with a flat bottom surface and flat non-vertical side walls having an angle α equal to 54.7°.

Alternately, wet etchants which are insensitive to the crystallographic planes, such as hydrofluoric nitric acid (HNA), can be used with any type of wafer to form opening 320. As illustrated in FIG. 4C, etchants which are insensitive to the crystallographic planes etch equally in all directions and, thereby, form opening 320 with a flat bottom surface and rounded side walls. After opening 320 has been formed as shown in FIG. 4B or 4C, masking layer 312 is removed in a conventional manner.

Figure 5:
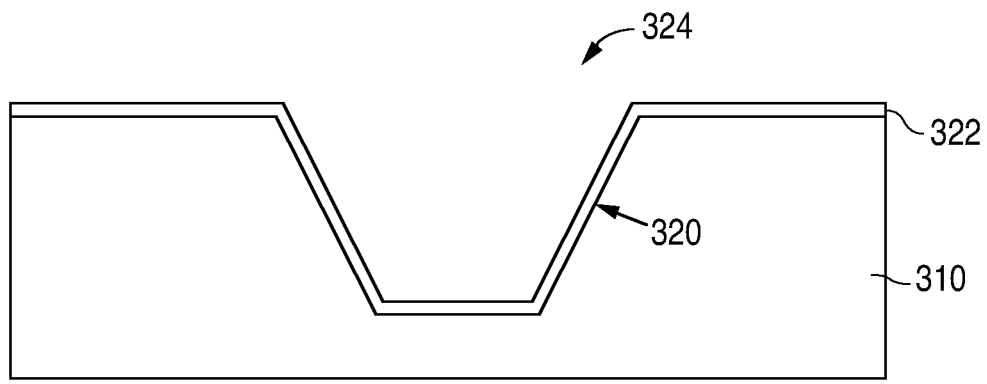
FIG. 5 is a cross-sectional view illustrating an example of the results of the third step of the method of forming the capacitor in accordance with the present invention.

FIG. 5 shows a cross-sectional view that illustrates an example of the results of the third step of the method of forming the capacitor in accordance with the present invention. As shown in FIG. 5, after opening 320 has been formed and masking layer 312 has been removed, the method of the present invention continues by inserting wafer 310 into the first chamber of the multi-chamber semiconductor processing system.

Once inserted into the first chamber, a dielectric layer 322 with a substantially uniform thickness is deposited on the top surface of wafer 310 in a conventional fashion. The deposition of dielectric layer 322 forms an opening 324. After the formation of dielectric layer 322, wafer 310 is removed from the first chamber. As shown in FIG. 5, dielectric layer 322 is conformally formed to line opening 320.

Figure 6:
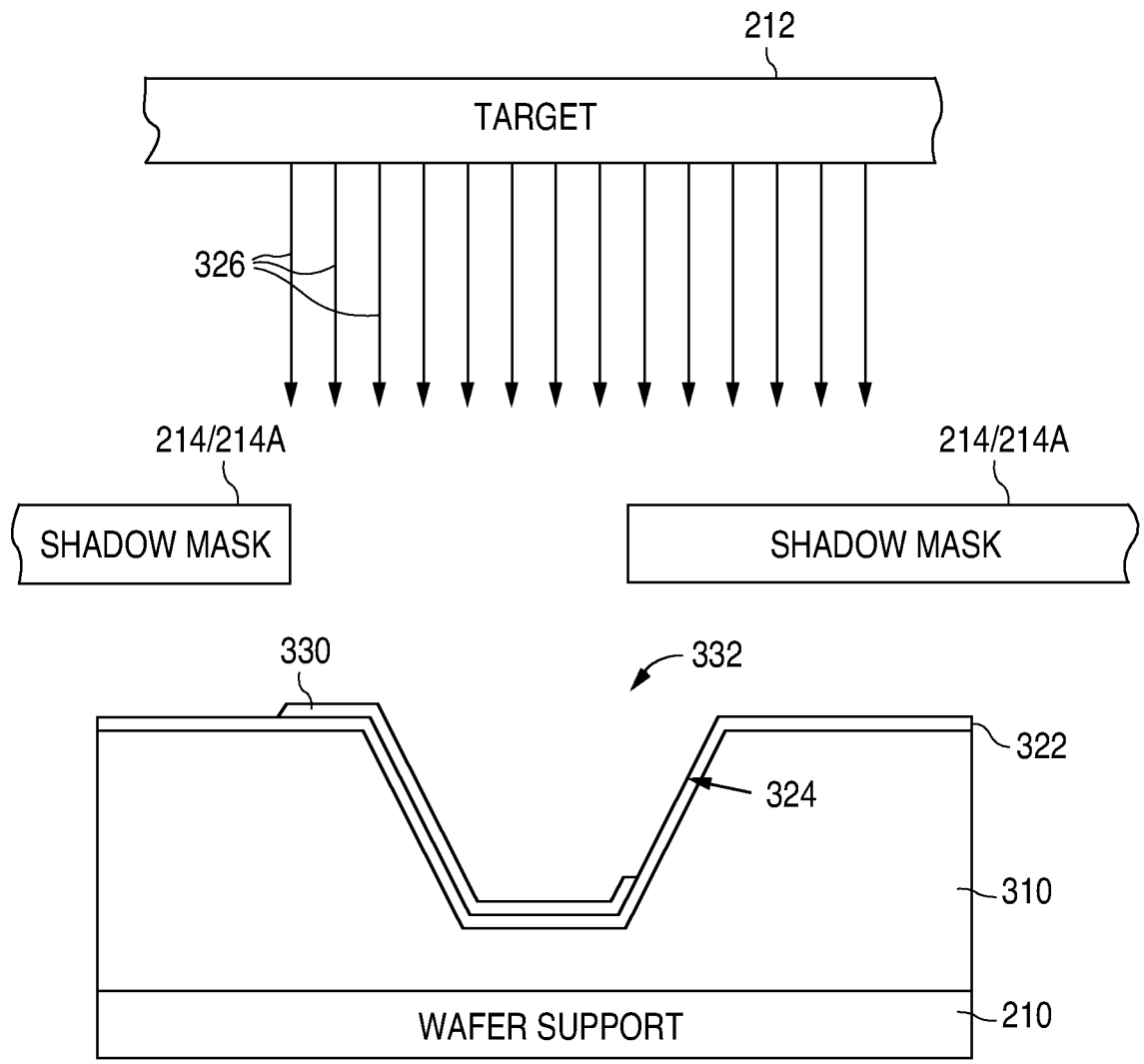
FIG. 6 is a cross-sectional view illustrating an example of the fourth step of the method of forming the capacitor in accordance with the present invention.

FIG. 6 shows a cross-sectional view that illustrates an example of the fourth step of the method of forming the capacitor in accordance with the present invention. As shown in FIG. 6, after wafer 310 has been removed from the first chamber, wafer 310 is inserted into the second chamber of the multi-chamber semiconductor processing system to lie on wafer support 210.

Once inserted into the second chamber, a number of first metal atoms 326 are dislodged from target 212 in a conventional fashion. The dislodged first metal atoms 326 are electrically attracted to wafer 310, which is grounded, and pass through shadow mask 214/214A to form a first metal structure 330 on the top surface of dielectric layer 322. The deposition of the first metal atoms 326 forms an opening 332.

As shown in FIG. 6, due to shadow mask 214/214A, first metal structure 330 extends from the top horizontal surface of dielectric layer 322, down one side of opening 324, across the bottom surface, and only partially up the opposite side of opening 324. As a result, first metal structure 330 touches the top horizontal surface of dielectric layer 322 on one side of opening 324, but does not touch the top horizontal surface of dielectric layer 322 on the opposite side of opening 324. After the formation of first metal structure 330, wafer 310 is removed from the second chamber.

In a conventional PVD process, the dislodged atoms 326 are highly anisotropic. As a result, first metal structure 330 has a substantially uniform thickness, except for the periphery which tends to be sloped as a result of the dislodged atoms 326 which are not perfectly anisotropic. In addition, to further improve on the feature definition, shadow mask 214/214A is placed as close as possible to the top surface of dielectric layer 322 without touching dielectric layer 322, thereby limiting the effect of the non-anisotropic atoms 326 that pass through shadow mask 214/214A.

Figure 7:
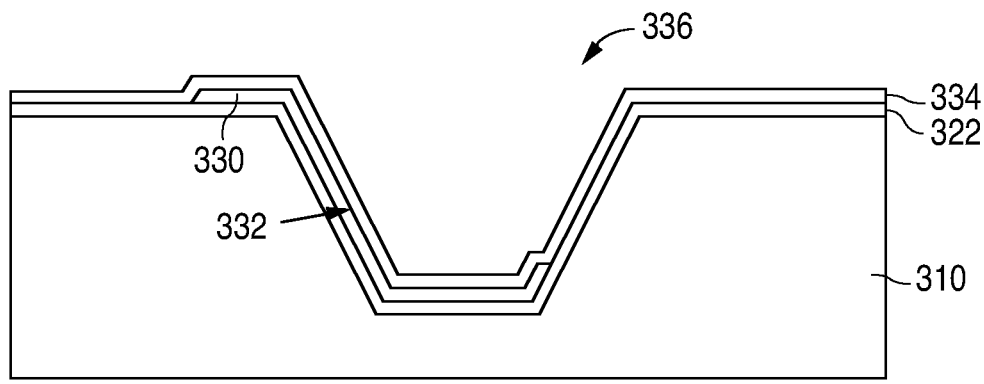
FIG. 7 is a cross-sectional view illustrating an example of the results of the fifth step of the method of forming the capacitor in accordance with the present invention.

FIG. 7 shows a cross-sectional view that illustrates an example of the results of the fifth step of the method of forming the capacitor in accordance with the present invention. After wafer 310 has been removed from the second chamber, wafer 310 is again inserted into the first chamber of the multi-chamber semiconductor processing system.

Once inserted into the first chamber, a dielectric layer 334 with a substantially uniform thickness is deposited on the top surface of dielectric layer 322 and first metal structure 330 in a conventional fashion. The deposition of the dielectric layer 334 forms an opening 336. After the formation of dielectric layer 334, wafer 310 is removed from the first chamber. As shown in FIG. 7, dielectric layer 334 is conformally formed over dielectric layer 322 and first metal structure 330.

Figure 8:
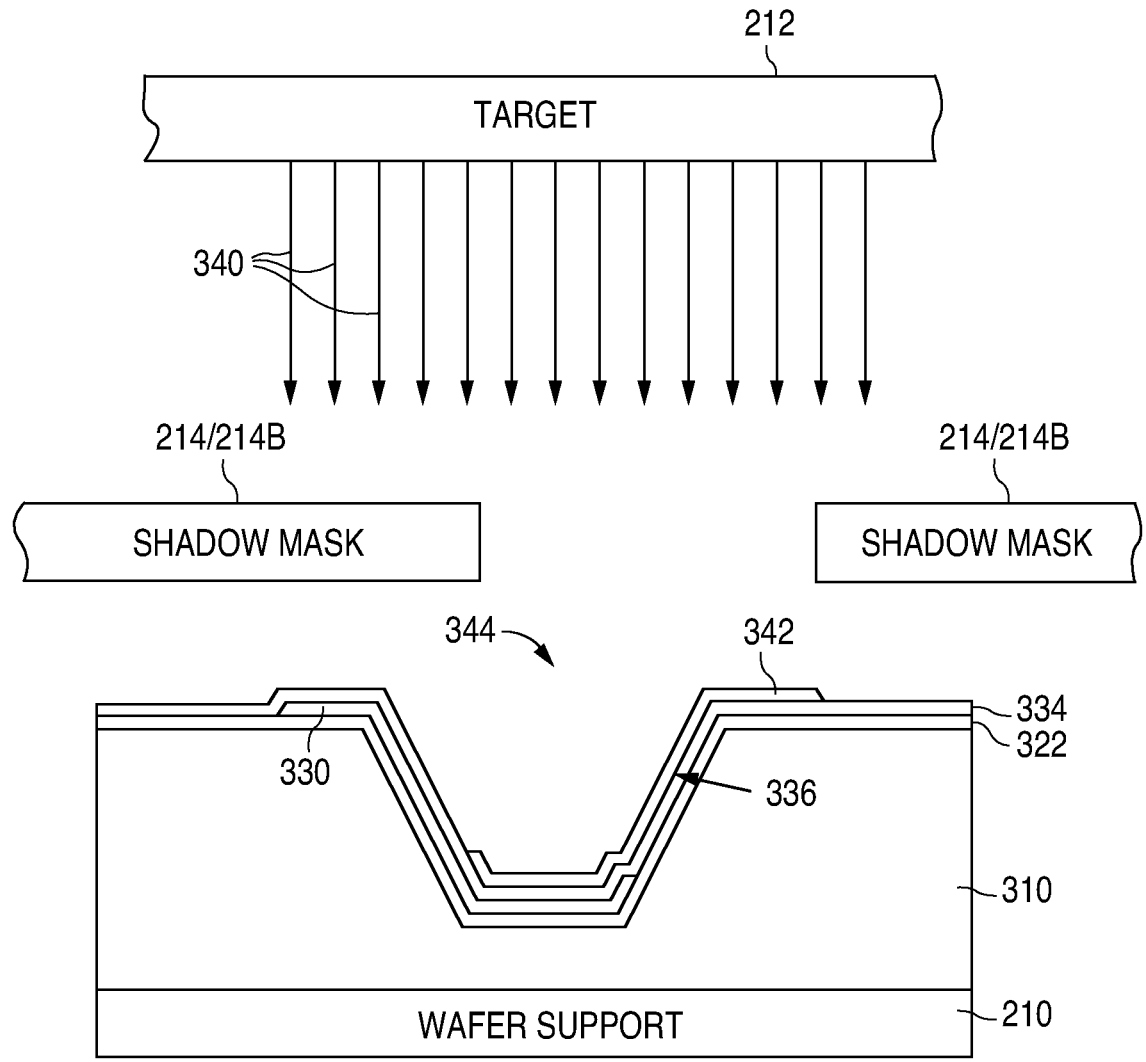
FIG. 8 is a cross-sectional view illustrating an example of the sixth step of the method of forming the capacitor in accordance with the present invention.

FIG. 8 shows a cross-sectional view that illustrates an example of the sixth step of the method of forming the capacitor in accordance with the present invention. As shown in FIG. 8, after wafer 310 has been removed from the first chamber, wafer 310 is inserted into the third chamber of the multi-chamber semiconductor processing system to lie on wafer support 210.

Once inserted into the third chamber, a number of second metal atoms 340 are dislodged from target 212 in a conventional fashion. The dislodged second metal atoms 340 are electrically attracted to wafer 310, which is grounded, and pass through shadow mask 214/214B to form a second metal structure 342 on the top surface of dielectric layer 334. The deposition of the second metal atoms 340 forms an opening 344.

As shown in FIG. 8, due to shadow mask 214/214B, second metal structure 342 extends from the top horizontal surface of dielectric layer 334, down one side of opening 336, across the bottom surface, and only partially up the opposite side of opening 336. As a result, second metal structure 342 touches the top horizontal surface of dielectric layer 334 on one side of opening 336, but does not touch the top horizontal surface of dielectric layer 334 on the opposite side of opening 336. After the formation of second metal structure 342, wafer 310 is removed from the third chamber.

As above, the dislodged atoms 340 are highly anisotropic. As a result, second metal structure 342 has a substantially uniform thickness, except for the periphery which tends to be sloped as a result of the dislodged atoms 340 which are not perfectly anisotropic. In addition, to further improve on the feature definition, shadow mask 214/214B is placed as close as possible to the top surface of dielectric layer 334 without touching dielectric layer 334, thereby limiting the effect of the non-anisotropic atoms 340 that pass through shadow mask 214/214B.

Figure 9:
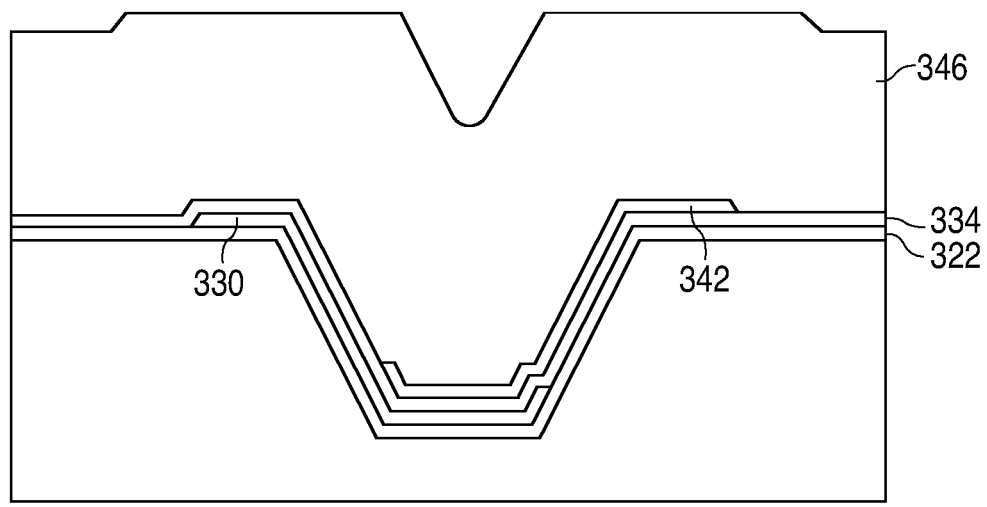
FIG. 9 is a cross-sectional view illustrating an example of the results of the seventh step of the method of forming the capacitor in accordance with the present invention.

FIG. 9 shows a cross-sectional view that illustrates an example of the results of the seventh step of the method of forming the capacitor in accordance with the present invention. After wafer 310 has been removed from the third chamber, wafer 310 is again inserted into the first chamber of the multi-chamber semiconductor processing system. Once inserted into the first chamber, a thick dielectric layer 346 is deposited on the top surface of dielectric layer 334 and second metal structure 342 in a conventional fashion. After the formation of dielectric layer 346, wafer 310 is removed from the first chamber.

Figure 10:
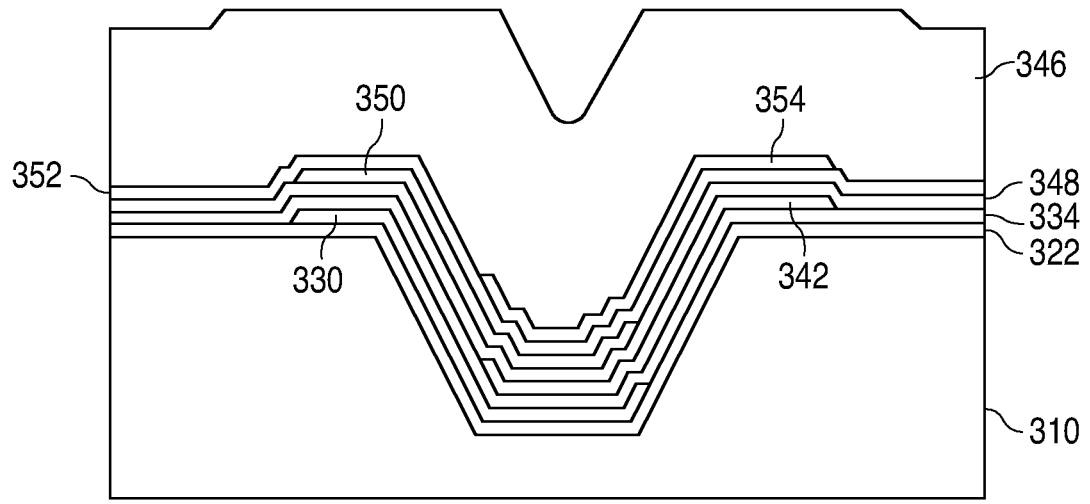
FIG. 10 is a cross-sectional view illustrating an example of a second round of n additional rounds of the method of forming the capacitor in accordance with the present invention.

The formation of the metal structures can be terminated following the formation of second metal structure 342 or, alternately, the formation of metal structures can continue for n additional rounds before dielectric layer 346 is formed. FIG. 10 shows a cross-sectional view that illustrates an example of a second round of n additional rounds of the method of forming the capacitor in accordance with the present invention.

As shown in FIG. 10, a second round of n additional rounds can be performed by moving wafer 310 into the first chamber, where a dielectric layer 348 with a substantially uniform thickness is formed on dielectric layer 334 and second metal structure 342. Next, wafer 310 is removed from the first chamber and inserted into the second chamber, where a third metal structure 350 is formed on dielectric layer 348. Following this, wafer 310 is moved from the second chamber back to the first chamber, where a dielectric layer 352 is formed on dielectric layer 348 and third metal structure 350.

After this, wafer 310 is moved from the first chamber to the third chamber, where a fourth metal structure 354 is formed on dielectric layer 352. Following this, wafer 310 is moved from the third chamber back to the first chamber, where thick dielectric layer 346 is formed on dielectric layer 352 and fourth metal structure 354.

The number of n additional rounds to be performed is defined by the capacitance value to be obtained, as limited by the dimensions of opening 320 (i.e., a shallow opening 320 can not accommodate a large number of metal structures) and an upper limit. The upper limit can be statistically determined by the defect rate and the allowable failure rate. For example, if one out of every thousand rounds has a defect that causes a capacitor to fail, and the allowable failure rate is one out of every fifty capacitors, then each capacitor can include an upper limit of 20 rounds.

One of the principal causes of failure is the formation of pin holes in the dielectric layers that separate the adjacent metal structures. As a result, each of the dielectric layers 322, 334, 346, 348, and 352 can be formed from multiple layers of material. Further, the multiple layers of material can include two or more different types of material. Multiple layers of dielectric material substantially reduce the likelihood that a pin hole in a dielectric layer can cause a capacitor to fail.

(Maintaining a vacuum as wafer 310 moves from chamber to chamber also significantly reduces the likelihood of forming a pin hole.)

The dielectric layers 322, 334, 346, 348, and 352 can be implemented with any conventional dielectric material, such as oxide, oxynitride, or nitride. Further, other materials, which require sintering, such as barium strontium titanate (BST), titanium oxide (TiOx), and barium titanate (BT) can also be used to implement the dielectric layers. These other materials determine the type of metal or alloy that can be used due to the sintering requirement.

The material used to form the targets 212 in the second and third chambers can be identical or different, and can be a metal or alloy which can be conformally deposited through a shadow mask in a multi-chamber system, and can withstand the remaining fabrication requirements, such as the processing temperatures and etch chemistries. Chrome, which has a low sheet resistance, is an example of a material that can be deposited to form the metal structures in the second and third chambers. Aluminum is also an example of a material that can be used.

Figure 11:
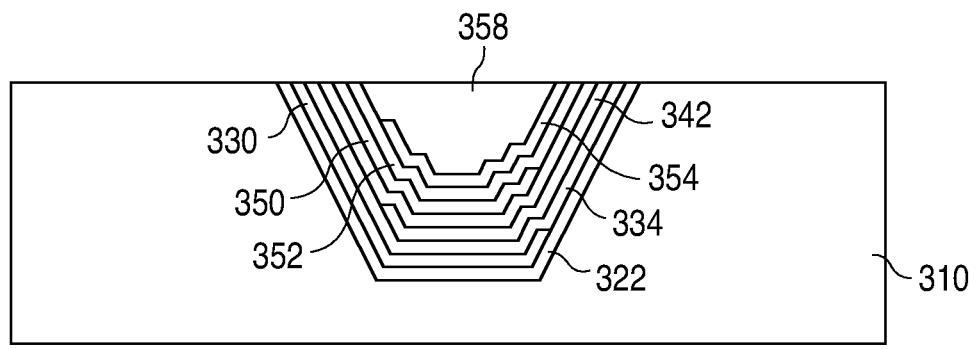
FIG. 11 is a cross-sectional view illustrating an example of the next step following completion of the n additional rounds and the seventh step in the method of forming the capacitor in accordance with the present invention.

FIG. 11 shows a cross-sectional view that illustrates an example of the next step following completion of the n additional rounds and the seventh step in the method of forming the capacitor in accordance with the present invention. As shown in FIG. 11, after the last metal structure 342 or 354 has been formed, wafer 310 is removed from the multi-chamber semiconductor processing system, and then planarized in conventional manner, such as with chemical-mechanical polishing.

As further shown in FIG. 11, the planarization forms non-conductive region 358 and removes metal structure 330, dielectric layer 334, metal structure 342, and dielectric layer 346 (and dielectric layer 348, metal structure 350, dielectric layer 352, and metal structure 354 when present) from lying over the top horizontal surface of wafer 310.

As a result, metal structure 330, dielectric layer 334, metal structure 342, and dielectric layer 346 (and dielectric layer 348, metal structure 350, dielectric layer 352, and metal structure 354 when present) lie completely within opening 320. The planarization can terminate after dielectric layer 322 has been removed from the top horizontal surface of wafer 310 as shown in FIG. 11 or, alternatively, after metal structure 330 has been removed from the top horizontal surface of dielectric layer 322.

Figure 12:
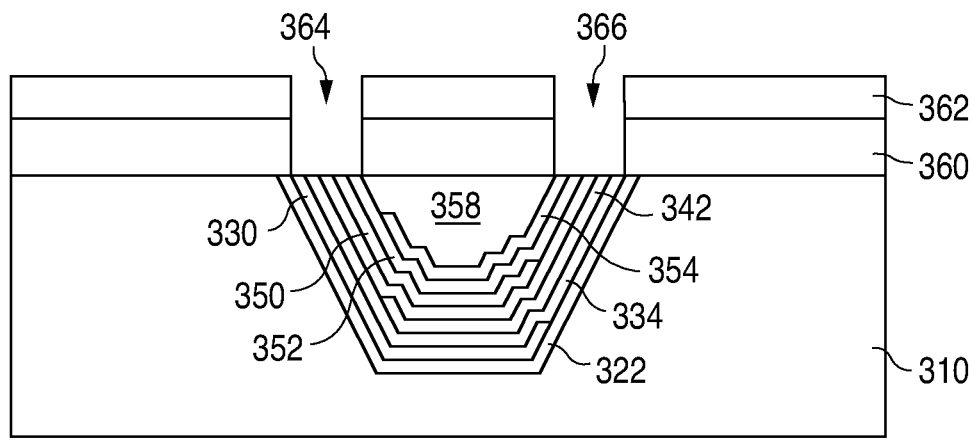
FIG. 12 is a cross-sectional view illustrating an example of the next step following the planarization in the method of forming the capacitor in accordance with the present invention.

FIG. 12 shows a cross-sectional view that illustrates an example of the next step following the planarization in the method of forming the capacitor in accordance with the present invention. As shown in FIG. 12, after the planarization has been completed, an isolation layer 360 is conventionally deposited on the top surface of wafer 310, followed by the conventional formation of a patterned photoresist layer 362. Isolation layer 360 can be implemented with, for example, oxide.

After patterned photoresist layer 362 has been formed, the exposed regions of isolation layer 360 are etched in a conventional manner to form a first opening 364 that exposes first metal structure 330 (and third metal structure 350 and any additional odd numbered structures that are present), and a second opening 366 that exposes second metal structure 342 (and fourth metal structure 354 and any additional even numbered structures that are present). Once the top surface of wafer 310 has been exposed, patterned photoresist layer 362 is removed in a conventional manner.

Figure 13:
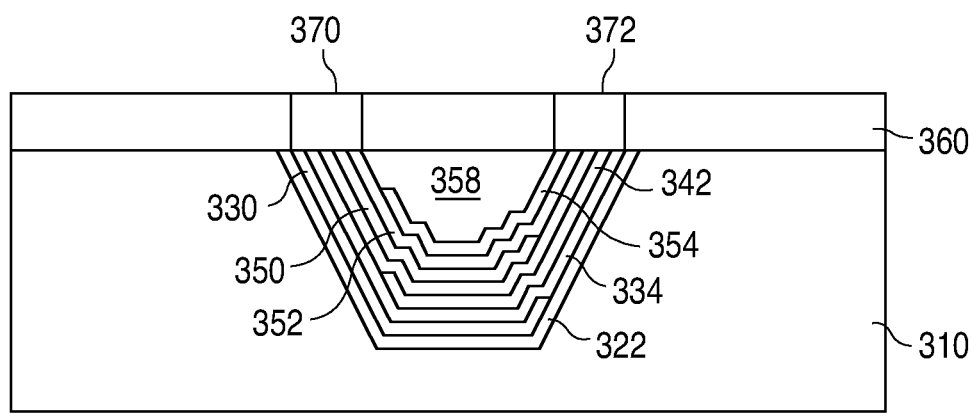
FIG. 13 is a cross-sectional view illustrating an example of the next step following the removal of patterned photoresist layer 362 in the method of forming the capacitor in accordance with the present invention.

FIG. 13 shows a cross-sectional view that illustrates an example of the next step following the removal of patterned photoresist layer 362 in the method of forming the capacitor in accordance with the present invention. As shown in FIG. 13, after patterned photoresist layer 362 has been removed, a metallic material, such as a contact/via material, is deposited on the top surface of isolation layer 360 to fill up the openings 364 and 366, and then planarized in a convention fashion to form a first metallic contact 370 in first opening 364 and a second metallic contact 372 in second opening 366.

First metallic contact 370 touches first metal structure 330 (and third metal structure 350 and any additional odd numbered structures that are present), and second metallic contact 372 touches second metal structure 342 (and fourth metal structure 354 and any additional even numbered structures that are present). Following this, the method continues with conventional back end processing steps.

Thus, a method has been described for forming a semiconductor capacitor with large area plates and a small footprint using shadow masks. One of the advantages of the present invention is that by using an anisotropic wet etch or an isotropic wet etch to form an opening in the wafer, each material deposited to form the capacitor lines the opening with a uniform thickness (except for the edges of the metal layers), thereby eliminating the thin spots and non-uniform coverage issues associated with conventional approaches.

Another advantage of the present invention is that the present invention forms a capacitor with only two lithography steps: namely, the step required to form opening 316 in masking layer 312, and the step required to form the openings 364 and 366 in isolation layer 360. Further, because the method of the present invention allows a large number of plates, e.g., 20 odd and 20 even plates, to be formed, the capacitor of the present invention can have very large capacitance values, e.g., in the micro-farad range.

Figure 14:
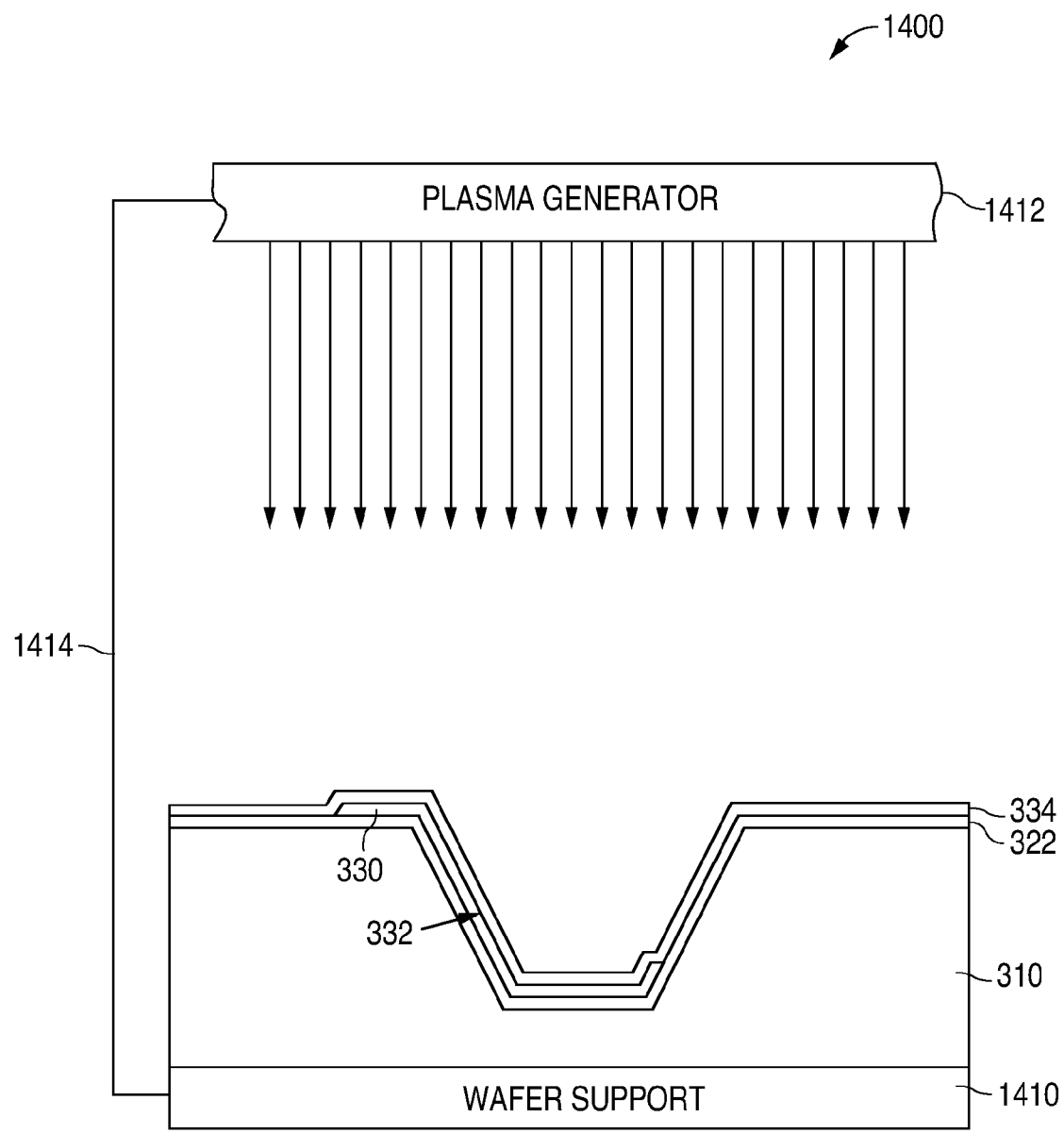
FIG. 14 is a cross-sectional view illustrating an example of a plasma etching chamber 1400 in accordance with a second embodiment of the present invention.

FIG. 14 shows a cross-sectional view that illustrates an example of a plasma etching chamber 1400 in accordance with a second embodiment of the present invention. As shown in FIG. 14, plasma etching chamber 1400, which is sealed during operation, includes a wafer support 1410, such as a chuck, and an RF plasma generator 1412 which lies above and spaced apart from wafer support 1410. In addition, plasma etching chamber 1400 also includes a frame structure 1414 that is connected to wafer support 1410 and RF plasma generator 1412 to support wafer support 1410 and RF plasma generator 1412.

In accordance with the second embodiment of the present invention, the multi-chamber semiconductor processing system can include a blanket plasma etching chamber that is implemented with plasma etching chamber 1400. In the second embodiment of the present invention, following the deposition of each dielectric layer and before the next metal structure is formed, a blanket plasma etch can be performed to remove the surface layer of the dielectric layer to remove any contaminants that may be present on the top surface of the dielectric layer. FIG. 14 illustrates a blanket plasma etch of dielectric layer 334.

Figure 15A:
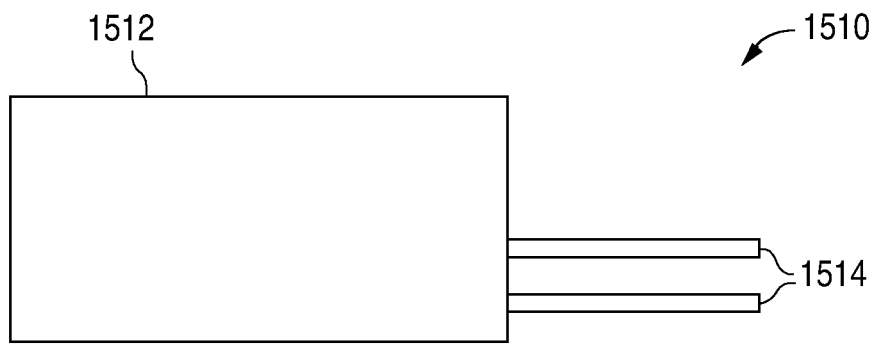
FIGS. 15A and 15B are plan views illustrating examples of definitional shadow masks in accordance with the present invention.
Figure 15B:
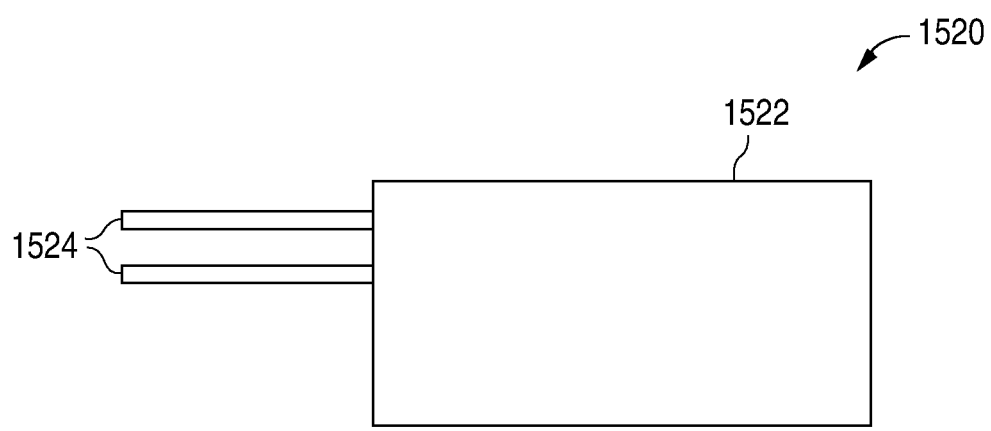

FIGS. 15A and 15B show plan views that illustrate examples of definitional shadow masks in accordance with the present invention. FIG. 15A shows a first definitional shadow mask 1510, while FIG. 15B shows a second definitional shadow mask 1520. As shown in FIG. 15A, definitional shadow mask 1510, which can be implemented with aluminum, includes a metal plate region 1512 which is generally the inverse of the opening in shadow mask 214A, and a number of support regions 1514 which connect the metal plate region 1512 to an adjacent structure.

Similarly, as shown in FIG. 15B, definitional shadow mask 1520, which can be implemented with aluminum, includes a metal plate region 1522 which is generally the inverse of the opening in shadow mask 214B, and a number of support regions 1524 which connect the metal plate region 1522 to an adjacent structure.

Figure 16:
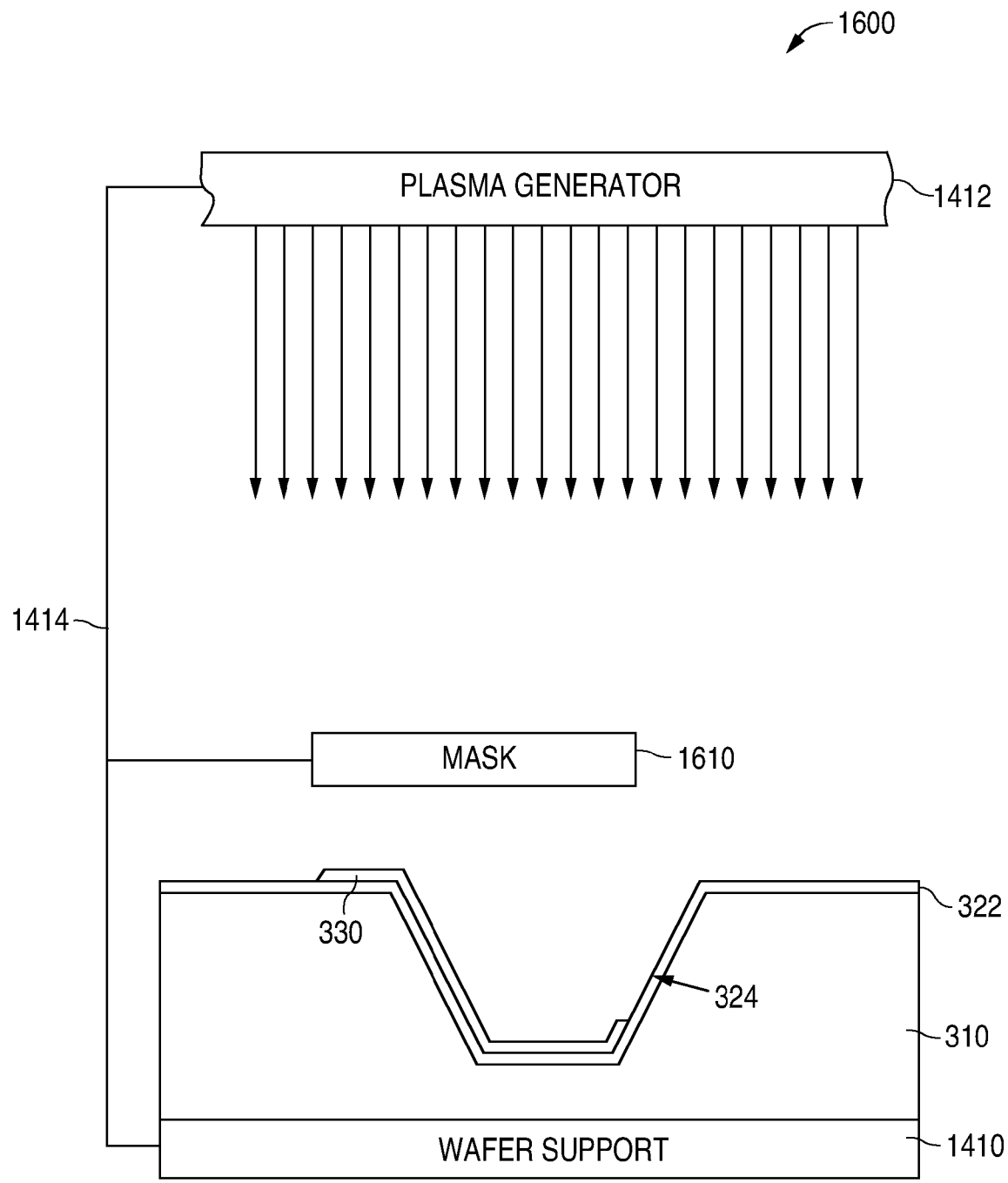
FIG. 16 is a cross-sectional view illustrating an example of a plasma etching chamber 1600 in accordance with a third embodiment of the present invention.

FIG. 16 shows a cross-sectional view that illustrates an example of a plasma etching chamber 1600 in accordance with a third embodiment of the present invention. As shown in FIG. 16, plasma etching chamber 1600 is similar to plasma etching chamber 1400 and, as a result, utilizes the same reference numerals to designate the structures which are common to both chambers.

As shown in FIG. 16, plasma etching chamber 1600 differs from plasma etching chamber 1400 in that plasma etching chamber 1600 includes a definitional shadow mask 1610 that is connected to frame structure 1414 to lie between wafer support 1410 and RF plasma generator 1412.

In accordance with the third embodiment of the present invention, the multi-chamber semiconductor processing system can include a first definitional plasma etching chamber that is implemented with plasma etching chamber 1600, where definitional shadow mask 1610 is implemented with definitional shadow mask 1510 as illustrated in FIG. 16, and a second definitional plasma etching chamber that is implemented with plasma etching chamber 1600, where definitional shadow mask 1610 is implemented with definitional shadow mask 1520.

In the third embodiment of the present invention, following the deposition of each of the odd numbered metal structure, e.g., first metal structure 330 and third metal structure 350, and before the next dielectric layer is formed, wafer 310 is plasma etched through definitional shadow mask 1610/1510 to remove any layer of metal that undesirably extends away from the metal structures 330 and 350.

For example, a thin layer of metal may undesirably extend up the right side of opening 324, so that a metal layer lies on the top horizontal surface of dielectric layer 322 on both sides of opening 324 due to the non-anisotropic atoms that passed through shadow mask 214A. The definitional plasma etch removes this thin layer of metal to insure that each metal plate lies on only one side of an opening.

Similarly, following the deposition of each of the even numbered metal structure, e.g., second metal structure 342 and fourth metal structure 354, and before the next dielectric layer is formed, wafer 310 is plasma etched through definitional shadow mask 1610/1520 to remove any layer of metal that undesirably extends away from the metal structures 342 and 354.

Figure 17:
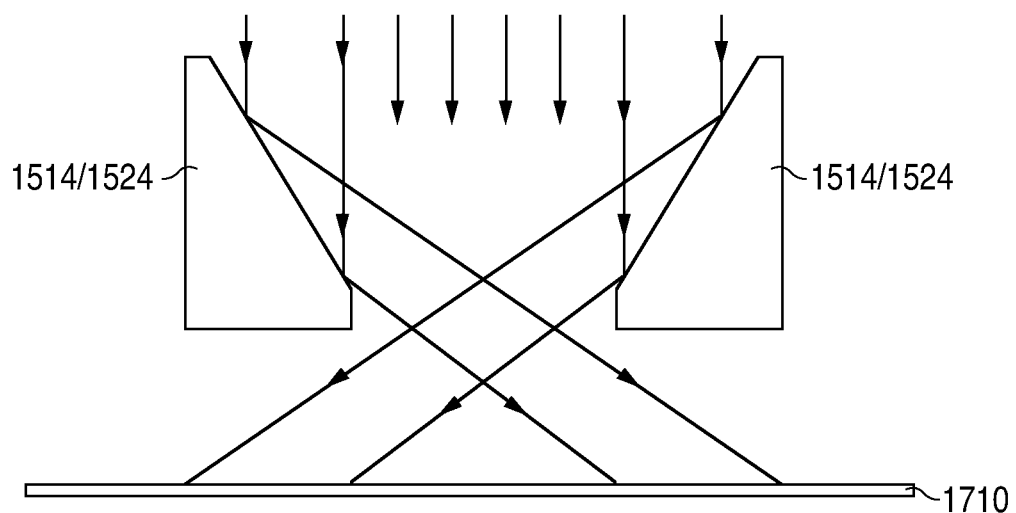
FIG. 17 is a cross-sectional view illustrating an example of the support regions 1514 and 1524 of the definitional shadow masks 1510 and 1520 in accordance with the present invention.

FIG. 17 shows a cross-sectional view that illustrates an example of the support regions 1514 and 1524 of the definitional shadow masks 1510 and 1520 in accordance with the present invention. As shown in FIG. 17, when a thin layer of metal 1710 undesirably extends away from a metal structure, the support regions 1514 or the support regions 1524 (depending on whether an odd or an even metal layer is being etched) block the plasma etch from removing the thin layer of metal 1710 that lies directly below the support regions 1514 and 1524.

However, as further shown in FIG. 17, the side walls of the support regions 1514 and 1524 are angled so that the plasma etching particles blocked by each support region 1514 and 1524 are reflected to remove the thin layer of first metal 1710 that lies directly below the adjacent support regions 1514 and 1524.

It should be understood that the above descriptions are examples of the present invention, and that various alternatives of the invention described herein may be employed in practicing the invention. Therefore, it is intended that the following claims define the scope of the invention and that structures and methods within the scope of these claims and their equivalents be covered thereby.

What is claimed is:

1. A method of forming a capacitor comprising:
forming a first opening in a semiconductor wafer;
forming a first non-conductive layer in the first opening to touch the semiconductor wafer, the first non-conductive layer having a substantially uniform thickness and forming a second opening;
depositing a plurality of first atoms on the first non-conductive layer to form a first metal structure in the second opening that touches the first non-conductive layer, the first atoms passing through a first shadow mask, the first shadow mask being spaced apart from a top surface of the first non-conductive layer, the first metal structure having a substantially uniform thickness and forming a third opening;
forming a second non-conductive layer in the third opening to touch the first non-conductive layer and the first metal structure, the second non-conductive layer having a substantially uniform thickness and forming a fourth opening; and
depositing a plurality of second atoms on the second non-conductive layer to form a second metal structure in the fourth opening to touch the second non-conductive layer, the second atoms passing through a second shadow mask, the second shadow mask being spaced apart from a top surface of the second non-conductive layer, the second metal structure having a substantially uniform thickness.

2. The method of claim 1 and further comprising etching a top surface of the second non-conductive layer before the plurality of second atoms are deposited to form the second metal structure.

3. The method of claim 1 and further comprising planarizing the semiconductor wafer to expose the first non-conductive layer, the second metal structure, the second non-conductive layer, and the first metal structure being exposed after planarizing the semiconductor wafer.

4. The method of claim 3 wherein after planarizing the semiconductor wafer, a first portion of the first metal structure lies vertically below the second metal structure, and a second portion of the first metal structure lies vertically below no portion of the second metal structure.

5. The method of claim 3 and further comprising forming a third non-conductive layer to touch the second metal structure, the second non-conductive layer, the first metal structure, and the first non-conductive layer.

6. The method of claim 5 and further comprising:
passing atoms through a first definitional shadow mask to etch the first metal structure after the first metal structure has been formed and before the second non-conductive layer is formed, the first definitional shadow mask being spaced apart from a top surface of the first metal structure; and
passing atoms through a second definitional shadow mask to etch the second metal structure after the second metal structure has been formed and before the third non-conductive layer is formed, the second definitional shadow mask being spaced apart from a top surface of the second metal structure.

7. The method of claim 5 and further comprising:
simultaneously forming a first opening in the third non-conductive layer to expose the first metal structure, and a second opening in the third non-conductive layer to expose the second metal structure; and forming a first metal contact in the first opening to make an electrical connection with the first metal structure, and a second metal contact in the second opening to make an electrical connection with the second metal structure.

8. The method of claim 7 wherein the first metal contact is spaced apart from the second metal structure, and the second metal contact is spaced apart from the first metal structure.

9. The method of claim 7 wherein the second non-conductive layer includes a plurality of layers of material.

10. The method of claim 9 wherein two of the plurality of layers of material are different.

11. The method of claim 7 wherein the second non-conductive layer is formed in a first deposition chamber, the first atoms are deposited in a second deposition chamber, and the second atoms are deposited in a third deposition chamber.

12. The method of claim 11 wherein the first chamber has an interior pressure that is less than an atmospheric pressure when the second non-conductive layer is formed, the second chamber has the interior pressure when the first atoms are deposited, and the third chamber has the interior pressure when the second atoms are deposited.

13. The method of claim 12 wherein the wafer is continuously exposed to the interior pressure when the wafer is moved between the first chamber, the second chamber, and the third chamber.

\* \* \* \* \*